United States Patent [19]

Forneris et al.

[11] 4,135,097
[45] Jan. 16, 1979

[54] ION IMPLANTATION APPARATUS FOR CONTROLLING THE SURFACE POTENTIAL OF A TARGET SURFACE

[75] Inventors: John L. Forneris, Lagrangeville; William W. Hicks, Wappingers Falls; John H. Keller, Newburgh; Charles M. McKenna, Fishkill; James A. Seirmarco, Buchanan, all of N.Y.

[73] Assignee: International Business Machines Corporation, Armonk, N.Y.

[21] Appl. No.: 794,276

[22] Filed: May 5, 1977

[51] Int. Cl.$^2$ .................................................. A61K 27/02
[52] U.S. Cl. .................................. 250/492 B; 250/306; 250/398
[58] Field of Search ............... 250/492 A, 492 B, 306, 250/309, 492, 398

[56] References Cited

U.S. PATENT DOCUMENTS

| B 518,226 | 2/1976 | McGinty | 250/492 A |
|---|---|---|---|
| 2,467,224 | 4/1949 | Picard | 250/399 |
| 2,890,342 | 6/1959 | Columbe | 250/398 |
| 3,182,220 | 5/1965 | Gabor | 313/63 |
| 3,507,709 | 4/1970 | Bower | 250/492 A |
| 3,547,074 | 12/1970 | Hirschfeld | 250/492 A |
| 3,622,782 | 11/1971 | Smith | 250/399 |
| 4,011,449 | 3/1977 | Ko et al. | 250/309 |

Primary Examiner—Harold A. Dixon
Attorney, Agent, or Firm—James M. Thomson; J. B. Kraft

[57] ABSTRACT

In an ion beam apparatus a structure for controlling the surface potential of the target comprising an electron source adjacent to the beam for providing electrons to the beam and means between the target and source for inhibiting rectilinear radiations, i.e., electron and other particle and photon radiations between said source and said target. This prevents heating of the target by the electron source and cross-contamination between the source and the target. A further structure is provided for the measurement of the ion beam current while controlling said surface potential of the target which includes: walls adjacent to and electrically insulated from the target and surrounding the beam whereby the walls and target provide a Faraday Cage, means for introducing variable quantities of electrons into the beam within the Faraday Cage, means for measuring the target current, means for combining and measuring the target and wall currents to provide said ion beam current measurement and means for varying the quantities of introduced electrons to control the target current and thereby the target surface potential.

6 Claims, 5 Drawing Figures

ION IMPLANTATION APPARATUS FOR CONTROLLING THE SURFACE POTENTIAL OF A TARGET SURFACE

BACKGROUND OF THE INVENTION

The present invention relates to ion bombardment or implantation apparatus and more particularly to such apparatus having expedients which permit the control of surface potential of the target, particularly a target having a bombarded surface which is formed in whole or in part of an electrically insulative material.

Ion implantation is a technology of rapidly increasing importance in the fabrication of integrated circuits, particularly bipolar integrated circuits. In this bipolar technology, there is an increasing demand for (1) high dosage but relatively low time cycle implantation operations, and (2) ion implantation technology useful for introducing impurities through openings having at least one lateral dimension no greater than one mil. Since the implantation dosage is dependent on the combination of current and time, it follows that in order to achieve high dosage in relatively short time, the technology must move in the direction of high current ion implantation beams having currents greater than 0.5 ma. It has been found that when making such high current ion implantations of conductivity-determining impurities through electrically insulative layer openings having dimensions in the order of 0.1 to 1 mil. as is required in the high density, large scale integrated circuits, there is a substantial tendency toward the impairment or destruction of portions of this electrically insulative layer as well as exposed semiconductor areas resulting in potential short circuits which render the integrated circuit inoperative.

We believe that such impairment or destruction occurs due to an electrical breakdown of a potential built up on the insulating layer arising from the charge deposited by the positive ions which make up the primary ion beam. This potential buildup is particularly pronounced in high current beams which have a high density of positive ions. Without being bound on the theory involved, we believe that in such high current beams, positive ions have such a high density that the floating cloud of electrons, which is inherently produced through the operation of the ion bombardment apparatus such as through secondary electron emission from material struck by the ion beam and neutral background gas ionization by the ion beam, is insufficient in quantity to fully neutralize the charge created by the positive ions on the target.

The concept of the positive ion beam and the effect of the secondary electron cloud is discussed in some detail in U.S. Pat. Nos. 3,997,846, 4,011,449 and 4,013,891, and in the article, "High Current Electron Scanning Method for Ion Beam Writing", W. C. Ko, at pp. 1832-1835, IBM Technical Disclosure Bulletin, Vol. 18, No. 6, November 1975, as well as in the text, "Ion Beams With Application to Ion Implantation", R. G. Wilson and G. R. Brewer, (John Wiley & Sons, New York, 1973) at pp. 132-143.

In addition, it appears that when the openings through which the ions are to be implanted have small lateral dimensions in the order of 1 mil. or less, secondary electrons which are normally produced by positive ions striking semiconductor substrate are minimized; this further contributes to the deficiency of available secondary electrons at the surface to neutralize the positive ion accumulation to prevent charge buildup. This effect is discussed in detail in copending application, Ser. No. 763,789, H. S. Rupprecht et al, filed Jan. 31, 1977 now U.S. Pat. No. 4,076,558.

While the problem described will arise in connection with such ion implantation through minute openings, similar problems may be expected to arise when the ion implantation is conducted with high current beams through thin regions in an electrically insulative layer over a semiconductor substrate rather than through openings in such an insulative layer.

The prior art has a suggested solution to this problem of charge buildup which involves directly irradiating the surface of the electrically insulative material with electrons in sufficient quanitity to produce a negative potential on the surface of the insulative material sufficient to offset any positive charge produced by the ions in the beam. We have found that when such a direct impingement method is utilized, less than desirable effects are produced. First, the electron source is usually a heated filament, metallic member of some sort, or plasma. Such electron source can be adversely affected by material emitted from the target during ion bombardment and, in addition, these sources can give off material which can contaminate the target. In addition, since the electron source is conventionally a heated member such as a heated filament, the heat from the source will produce an undesirable heating effect at the target. Thus, if the target is covered with an electrically insulative material such as photoresist which is affected by heat, then the heated filament may damage the target.

In addition, since ion beam dosimetry, i.e., the measurement and control of ion beam current, is considered to be significant in ion implantation apparatus, there is the need in the art, particularly with high current beams, for a method and apparatus for controlling and minimizing the positive surface potential of the target which is compatible with dosimetry apparatus for measuring the beam current.

SUMMARY OF THE PRESENT INVENTION

Accordingly, it is a primary object of the present invention to provide ion beam bombardment apparatus in which the buildup of positive surface charge at the target surface is minimized.

It is another object of the present invention to provide ion beam bombardment apparatus in which the buildup of positive charge on a surface of insulative material formed on a semiconductor substrate is minimized.

It is yet another object of the present invention to provide ion beam bombardment apparatus in which the buildup of positive charge on a layer of electrically insulative material of the target is minimized along with the minimum of contamination of the target resulting from the apparatus for limiting such buildup.

It is even another object of the present invention to provide ion beam bombardment apparatus in which the buildup of positive charge on a layer of electrically insulative material on the target is minimized without damaging the insulative layer, or substrate areas exposed in openings in the insulative layer.

It is a further object of the present invention to provide a method of ion implantation through the minute openings in insulative layers required in dense integrated circuits which is not subject to insulative layer breakdown or damage to areas exposed in such openings.

It is yet a further object of the present invention to provide a method of ion bombardment utilizing high current beams which is not subject to breakdown of the insulative layer over the integrated circuit being bombarded or damage to substrate areas exposed in openings in said insulative layer.

It is an even further object of the present invention to provide ion beam bombardment apparatus with both ion beam measurement capability and capability for minimizing the buildup of positive charge at the target surface.

The above and other objects of the present invention are achieved by apparatus for bombarding a target with a beam of ions having a structure for controlling the surface potential of the target which comprises a combination of an electron source adjacent to the beam for providing electrons to the beam and means between the target and this electron source for inhibiting direct rectilinear radiations between the source and target. Such radiations include the electrons produced by the source as well as other particulate radiation and photon radiation. In other words, the inhibiting means or shield prevents a straight line path of electrons from the electron source to the target. Consequently, there is no radiation directly projected or impinged upon the target by the electron source. Also, the shield prevents material which is evaporated from the source from contaminating the target. During the operation of the source and particularly when the source is a heated filament such as tungsten, tantalum or thoriated iridium, such materials are evaporated from the source. The shield prevents target contamination. In addition, the shield prevents any positive ions which may incidentally be sputtered off the target by the ion beam from directly damaging or contaminating the source structure. Further, with a heated source like a filament, the shield prevents the source from heating the target to thereby damage heat sensitive materials like photoresists.

In accordance with another aspect of the present invention, the apparatus for ion bombarding the target with a beam of ions includes a structure for measuring the ion beam current and controlling the surface potential of the target which comprises walls adjacent to and electrically insulated from the target and surrounding the beam whereby the walls and target provide a Faraday Cage, means for providing variable quantities of electrons within the Faraday Cage, means for measuring the target current, means for combining and measuring the target and wall currents to provide said ion beam current measurement, and means for varying the quantities of provided electrons to control the target current and thereby said target surface potential.

The key to this latter aspect of the present invention resides in the ability to monitor or measure the net target current which is an indicator of the surface potential of the target being bombarded. However, since the target current also represents an essential part of any ion beam current measurement, the Faraday Cage must be so arranged that the walls are electrically insulated from the target, i.e., the total wall current is measured separately from the target current; then, the target current and the wall current may be combined to provide the ion beam current measurement.

Utilizing the apparatus of the present invention, the target having layers of electrically insulative material thereon such as semiconductor wafers coated with insulative layers may be ion implanted while minimizing positive charge buildup on the insulative surface even when utilizing high current ion beams having current of at least 0.5 ma. The positive charge buildup is avoided by monitoring the target current. So long as the target current is maintained at zero or at a negative level, preferably a slightly negative level, the positive potential buildup on the target insulative layer surface cannot occur. The target current may be adjusted by varying the quantities of electrons being introduced in the apparatus. This may be accomplished by conventional variations in the operating conditions of the electron source.

The foregoing and other objects, features and advantages of the invention will be apparent from the following more particular description of the preferred embodiments of the invention, as illustrated in the accompanying drawings.

DESCRIPTION OF PREFERRED EMBODIMENTS

Figure 1:
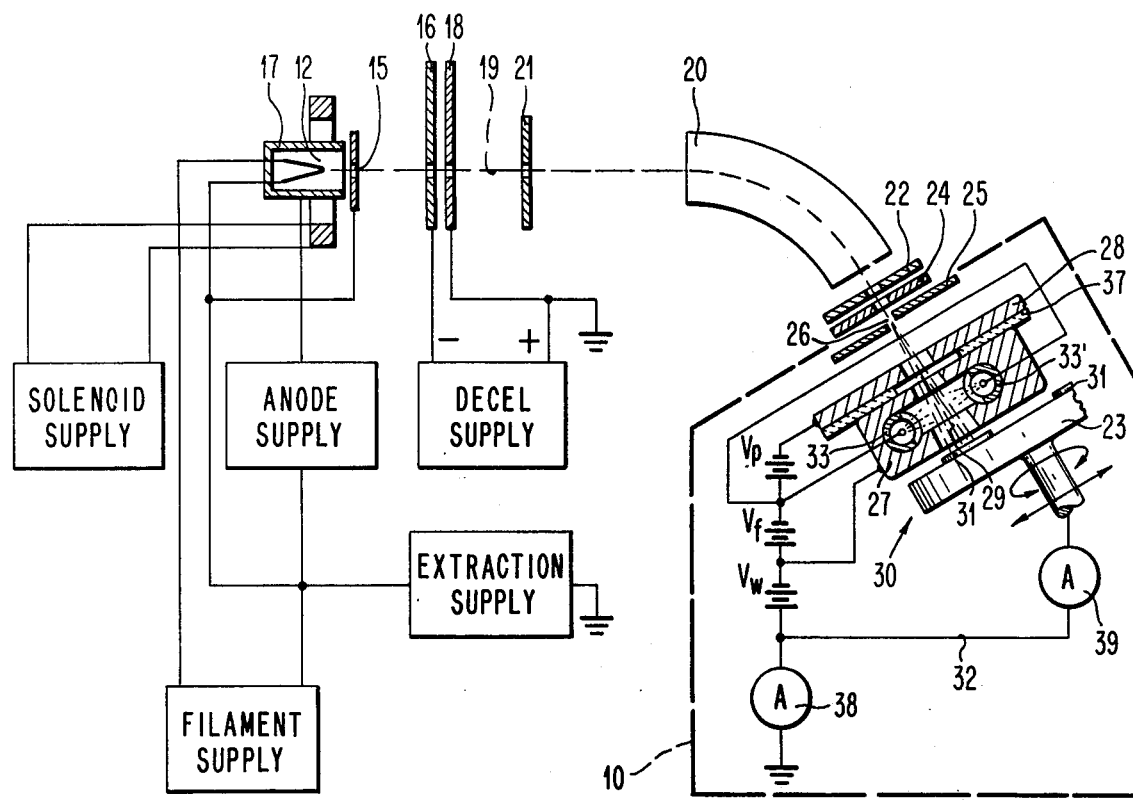
FIG. 1 discloses a schematic representation of an ion implantation apparatus in order to illustrate the operative association of the overall apparatus to the structure of the present invention for controlling target surface potential and for measuring beam current; the apparatus of the present invention is shown in greater detail in FIG. 1A which is an enlargement of the portion defined by the dashed lines and shown in a partial sectional view in FIG. 1.

Referring now to the drawings and initially to FIG. 1, the structure of the present invention for measuring the ion beam current and controlling the surface potential of the target is shown within the dashed lines 10 as it is related to a conventional ion implantation apparatus. It should be recognized that the remainder of the apparatus in FIG. 1 outside of box 10 is schematic in nature and represents conventional ion implantation apparatus such as that described in U.S. Pat. No. 3,756,862. The apparatus in FIG. 1 includes a conventional ion source 12 which may be any suitable high density source, althugh in the embodiments illustrated, a hot filament electron impact source is shown adapted to be operated in an oscillating electron discharge mode. An ion beam is extracted from the source in the conventional manner through extraction electrode 16 via aperature 15. Electrode 16 which is also known as an accel-electrode is maintained at a negative potential by the decel supply. The source electrode 17 is maintained at a positive potential with respect to filament 12 by the anode supply. A decel-electrode 18 is also provided, adapted to be maintained at ground potential. It should be recognized that the bias voltages described may be varied in the operations of the device by those skilled in the art.

The beam extracted from the ion source by the electrode arrangement disclosed is transmitted along a beam path generally indicated at 19 to an analyzing magnet 20 of conventional design. The beam is further defined in the conventional manner by apertured plates 21 and 22 located on either side of the analyzing magnet. A conventional beam defining aperture 24 is included in the apparatus as illustrated, Then, the beam is further defined by aperture 26 formed in plates 25 and strikes target 23.

Figure 1A:
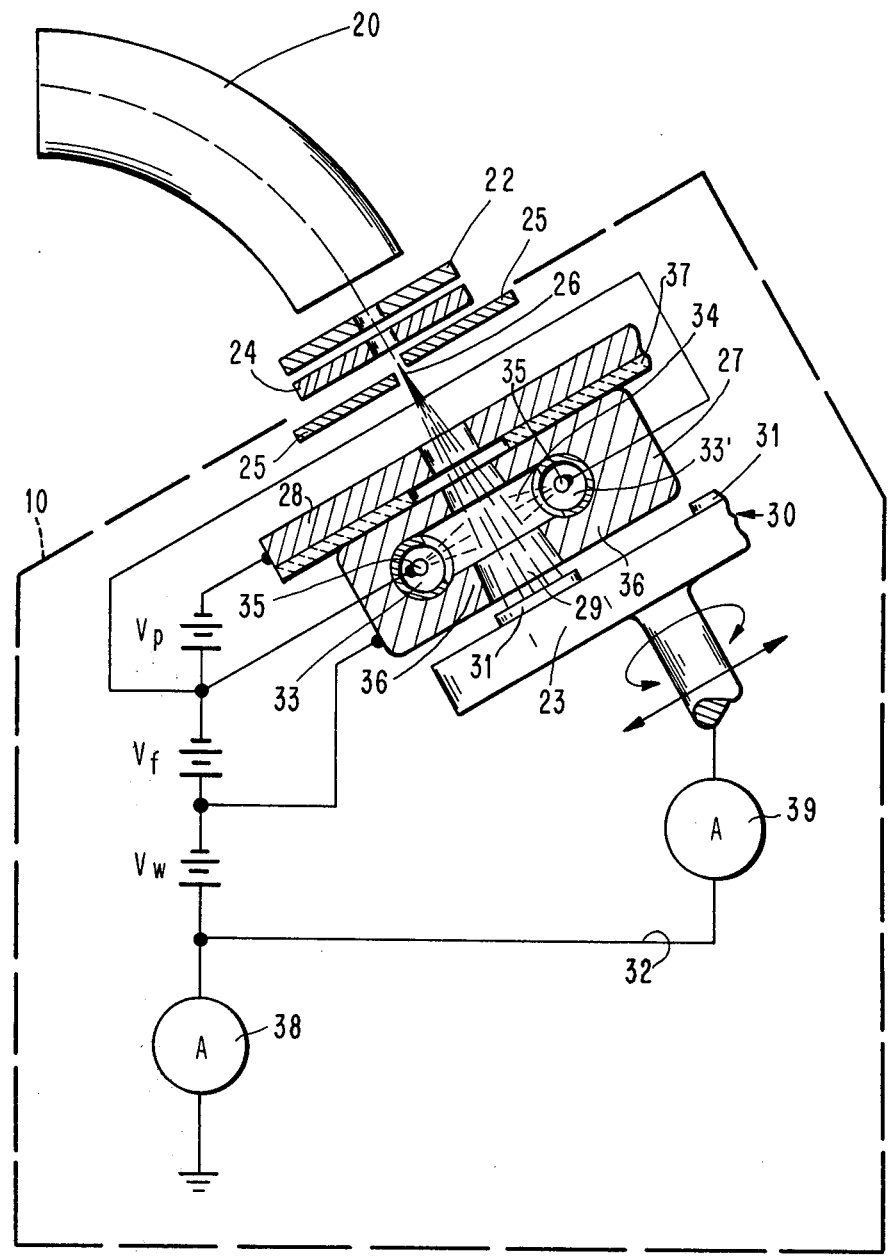

Now with particular reference to the structure of the present invention which permits the control of the surface potential of the target while practicing accurate dosimetry, i.e., measurement of the ion beam current, reference is made to the structure shown diagrammatically within dashed line box 10 which is enlarged in FIG. 1A. The structure is a modified Faraday Cage structure of the type described in U.S. Pat. No. 4,011,449 used to measure the beam current. Target 23 combines with adjacent walls 27 and rear walls 28 to form a Faraday Cage structure surrounding ion beam 29. Target 23 comprises a semiconductor wafer holder 30 supporting a plurality of wafers 31. The wafer holder is rotated and oscillated in the direction indicated by a standard deflection apparatus such as that described in U.S. Pat. No. 3,778,626 in order to ensure uniform distribution of the ion beam 29 across the surfaces of all of the wafers 31 mounted on the target support 30. Alternatively, of course, the Faraday Cage arrangement of the present invention may function with a stationary target 23. The Faraday Cage including the target is enclosed in any suitable conventional chamber (not shown) for maintaining a high vacuum in the ion implantation apparatus.

Adjacent walls or side walls 27 must be electrically insulated from target 23. In the present embodiment it is shown spaced from target 23. Side walls 27 are biased at a more negative potential than the potential being applied to target 23. In the embodiment shown, target 23 is biased at ground through connector 32 and walls 27 are biased more negatively with respect to ground by supply $V_w$. Electron sources 33 and 33' are conventional electron sources designed to introduce variable quantities of electrons 34 into ion beam 29 in order to have a sufficient quantity of electrons in the region of the ion beam to neutralize any charge buildup which may result in an undesirable positive potential formed at the surface of wafer 31 being implanted. The problem of such an undesirable charge buildup particularly when high current ion beams, i.e., ion beams having currents of at least 0.5 ma., are used to bombard or implant semiconductor wafers having only minute openings or no openings at all through insulative layers has been discussed above. Electron sources 33 and 33' may be any conventional source of electrons such as a heated filament which emits electrons. Alternatively, it may be conventional plasma bridges, electron guns with or without magnetic fields or field emission electrodes. The electron source filament 35 is supplied by a conventional power supply, not shown, which may be varied to increase or decrease a current through filament 35 and thereby to increase or decrease the electrons 34 which are being emitted into the path of ion beam 29. The filament is preferably biased by biasing voltage $V_F$ to a negative level with respect to side walls 27. It is important that electron sources 33 and 33' be set into recesses formed in side walls 27 to such an extent that there is no rectilinear or line-of-sight path connecting any part of the filament to any part of the wafer; the wall portions 36 of walls 27 act to shield against such a path.

Rear wall 28 is separated from side wall 27 by a layer of electrically insulative material 37. Voltage supply $V_p$ serves to bias the rear wall 28 as the most negative with respect to side walls 27 and filament 35. With the biasing arrangement shown, the electrons 34 introduced into the beam as well as the secondary electron cloud which accompanies the ion beam are contained within Faraday Cage formed by rear walls 28, side walls 27 and target 23, and are moved away from the walls in the direction toward the target. The following are some typical operating parameters. When utilizing apparatus operating at an energy level in the order of 50 Kev. with ions such as arsenic, and beam currents in the order of 0.5 ma. or higher, best results are achieved by maintaining the target at ground potential, a bias on side walls 27 of about $-50$ volts, a total bias on the filaments 35 of about $-60$ to $-100$ volts and a total bias on rear walls 28 of $-200$ volts. The beam current measurement is determined by combining the current from all of the elements, i.e., the current from target 23, from side walls 27 and from rear wall 28 at ammeter 38 to provide a reading of the beam current in a manner similar to that described in U.S. Pat. No. 4,011,449. At the same time, the target current alone may be monitored through ammeter 39 to provide a reading of the target current which permits the adjustment of the electrons 34 being introduced into the beam 29 from filament 35. As set forth hereinabove, in order to prevent a buildup of a positive potential on any insulative layer formed on the surface of a target wafer 31, it is desirable that the target current be either at zero or negative to some extent.

Figure 2:
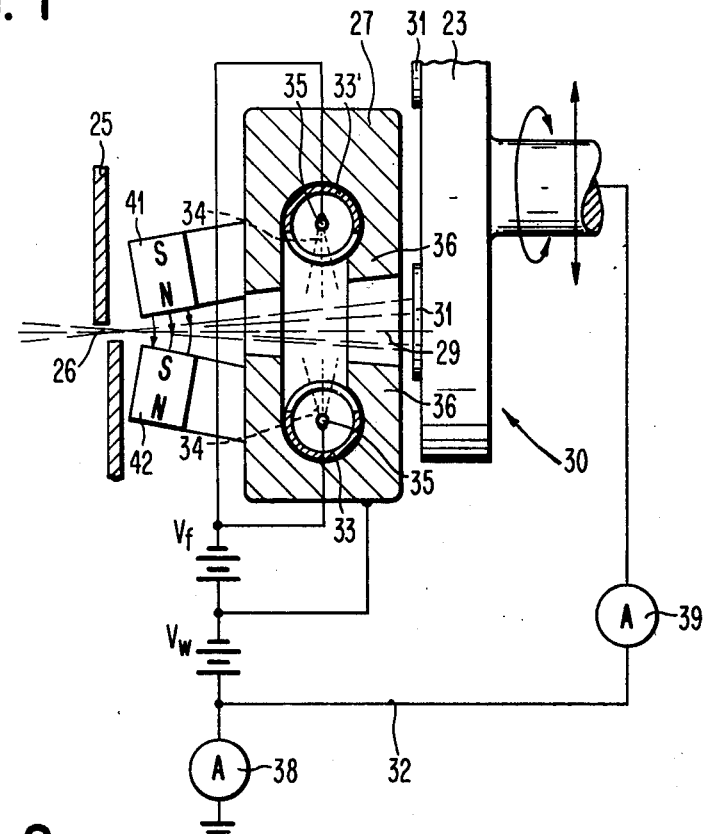
FIG. 2 is a partial sectional view of an alternate embodiment of the current-measuring and target-surface potential-controlling apparatus of the present invention.

In the structure of FIG. 1A, the function of rear wall 28 which is biased at the most negative level in the Faraday Cage is to ensure that a minimum of the electrons will exit the Faraday Cage from the open rear of the cage. In a modified alternate embodiment of this structure as shown in FIG. 2, rear wall 28 may be eliminated and a magnetic field perpendicular to the ion beam may be created by a pair of magnets 41 and 42. This field will substantially prevent any rearward movement of the electrons associated with ion beam 26 by functioning in the conventional manner as an electron barrier.

As will be set forth in co-pending application entitled, "Ion Implantation Apparatus With A Cooled Structure Controlling The Surface Potential Of A Target Surface", McKenna, et al, filed on the same date as the present application, May 5, 1977 Ser. No. 794,275, with ion beams implanting certain dopants such as arsenic which evaporate readily under operating temperatures, a problem may arise due to the precipitation of evaporated arsenic on the target. In the standard operation of ion implantation equipment, any arsenic which is evaporated during the operations would precipitate on the walls of the Faraday Cage adjacent to the target. However, where as is the case with the present structure, electrons are being provided to the ion beam from a heated source such as filament 35 which operates at temperatures in the order of from 1500° to 2700° C., the walls 27 and particularly the shield portions 36 thereof become quite hot. Because the walls and shield are at a higher temperature than the target, any arsenic vapor tends to deposit on the target wafer surface. This distorts the processing and particularly the arsenic doping level measured from the implantation of arsenic. This occurs because the evaporated arsenic is not in the ionic state (it is essentially neutral) and consequently, is not measured by the dosimetry apparatus during the implantation stage. However, since it is deposited on the wafer surface, it is driven into the wafer during subsequent high heat processing stages of the wafer. Consequently, quantities of arsenic which are not accounted for by the ion implantation dosimetry end up in the wafer and thereby potentially will distort the desired implantation dosages and dopant concentration levels in the wafer.

In addition, arsenic which may have been plated on to the structure walls during a previous implantation cycle may be evaporated from the walls during a subsequent implantation cycle to adversely affect the dosimetry in the subsequent cycle.

Figure 3A:
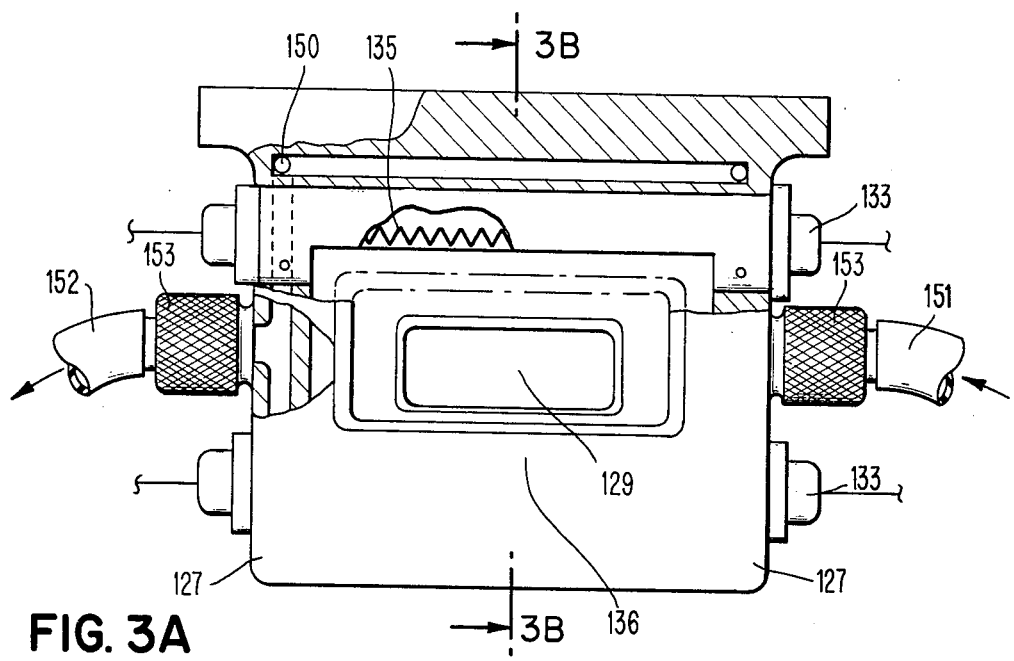
FIG. 3A is a fragmentary front view of a portion of the apparatus for controlling the target surface potential containing a modification for cooling the electron shield; the view is taken from the target position looking along the axis of the beam.
Figure 3B:
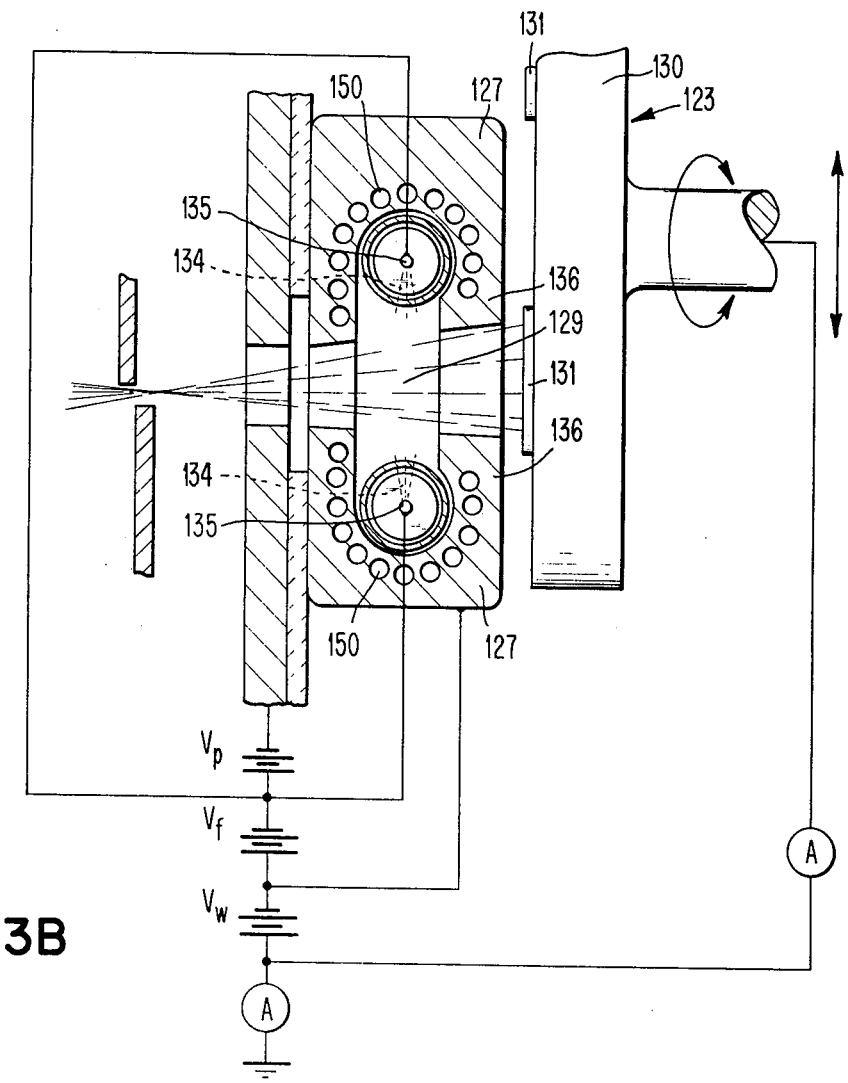
FIG. 3B is a diagrammatic partial sectional view of the apparatus in FIG. 3A taken along lines 3B — 3B.

Accordingly, the above mentioned copending McKenna et al application provides for cooled shield and wall members in apparatus which is particularly useful for the bombardment or implantation with materials such as arsenic which readily vaporize under operating conditions. In such cooled structures, the structure of the present invention as shown in FIG. 1A is modified in accordance with the teaching of the copending application as shown in FIG. 3B which is a sectional view taken along lines 3B—3B of FIG. 3A. FIG. 3A is a front view of the implantation apparatus taken from the target facing the beam along the axis of the beam. Because much of the apparatus in FIGS. 3A and 3B are substantially the same as that shown in FIGS. 1 and 1A, for convenience in illustration and description the elements in FIGS. 3A and 3B which are equivalent to elements in FIGS. 1 and 1A will be designated with the same numbers as the elements in FIGS. 1 and 1A preceded by the digit "1", e.g., side wall 27 in FIG. 1A is equivalent to side wall 127 in FIGS. 3A and 3B. In this manner, when an element in FIGS. 3A and 3B is mentioned which is the equivalent of an element in FIGS. 1 and 1A no further description will be made and it will be assumed that it operates in the same manner as in the original structure. In FIGS. 3A and 3B, wafers 131 are being implanted with ion beam 129. The wafers are mounted on target support 130 of target structure 123. Side walls 127 are modified to contain cooling conduits 150 which are connected to input conduit 151 through which fluid enters the cooling system and conduit 152 through which fluid exits the cooling system. A coolant such as compressed air or fluorocarbon coolant may be passed through the conduits to cool walls 127 and particularly shielding portions 136 thereof to maintain these walls at a temperature below that of the target irrespective of the temperature of filaments 135 which introduce electrons 134 into the ion beam 129. The coolants used must be electrically insulative in character so that they do not affect the dosimetry, i.e., the ion beam measurement operation of the apparatus. Likewise, the external portions of the cooling system should be electrically insulated from the walls of the Faraday Cage. As shown in FIG. 3A, connectors 153 are made of electrically insulative material and act to insulate conduits 151 and 152 from walls 127.

In FIG. 3A, a section is broken away to show the disposition of one of the filaments 135 of electron source member 133 with respect to beam 129. In all other respects, the elements of FIGS. 3A and 3B function in substantially the same manner as their equivalent elements in FIGS. 1 and 1A. Further, the cooled beam-current-measuring and surface-potential-controlling apparatus shown in FIGS. 3A and 3B is used in combination with conventional ion implantation apparatus, the remainder of which is diagrammatically shown in FIG. 1.

With the cooling apparatus described, when the filament is heated to temperatures in the order of 1500° to 2700° C., the walls 136 are maintained at less than 100° C. during ion beam operation, while the target which is heated mainly by the ion beam reaches a higher temperature of about 150° C.

While the invention has been particularly shown and described with reference to the preferred embodiments thereof, it will be understood by those skilled in the art that various changes in form and details may be made therein without departing from the spirit and scope of the invention.

What is claimed is:

1. Ion beam apparatus consisting of means for generating a beam of ions and directing said beam along a column to the surface of a target for bombarding said target with said ion beam, and means for measuring the ion beam current and controlling the surface potential of the target including walls spaced adjacent to and electrically insulated from said target and surrounding said beam whereby the walls and target provide an electron confining cage,
　electron source means for providing variable quantities of electrons within said cage,
　means for measuring the target current,
　means for combining and measuring the target and the wall currents to provide said ion beam current measurement,
　means between said target and said electron source for inhibiting direct rectilinear radiations between said source and said target, and
　means for varying the quantities of provided electrons to control the target current and thereby the target surface potential.

2. The apparatus of claim 1 including means for biasing the wall at a negative potential with respect to the target.

3. The apparatus of claim 2 wherein the cage includes an additional wall defining an opening along the axis of said ion beam opposite to the target through which the ion beam enters the cage, and wherein the additional wall is electrically insulated from said wall adjacent to said target, and
　further including means for biasing the additional wall at a negative potential with respect to said walls adjacent to the target.

4. The apparatus of claim 3 wherein said electron source is a heated filament source.

5. The apparatus of claim 4 wherein said walls have at least one recess formed therein and said electron source is so positioned in the recess that the portion of said walls defining said recess act to shield the target from said source.

6. The apparatus of claim 2 wherein
　said walls further define an opening along the beam axis opposite to the target through which the ion beam enters the cage, and
　further including means proximate said opening for providing a fixed magnetic field within said cage perpendicular to said ion beam.

* * * * *